(12) United States Patent
Peter et al.

(10) Patent No.: US 6,477,060 B1
(45) Date of Patent: Nov. 5, 2002

(54) DUAL CHANNEL BUS ROUTING USING ASYMMETRIC STRIPLINES

(75) Inventors: Erik W. Peter, Hillsboro; Jeffrey M. Shuey, Sherwood; Ronald Martin, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 09/608,907

(22) Filed: Jun. 30, 2000

(51) Int. Cl.[7] .................................................. H05K 1/14

(52) U.S. Cl. .................. 361/795; 361/748; 361/751; 361/818; 174/255; 174/260; 333/128; 257/700; 257/702; 438/125

(58) Field of Search .................................. 361/795, 748, 361/792, 793, 751, 717, 816, 818; 174/255, 260, 261, 252; 333/204, 128, 114; 257/700, 702, 698, 759, 642; 438/125

(56) References Cited

PUBLICATIONS

Direct Rambus System and board Design Considerations, May 1998, Mountain View, CA, pp. 1–3.
James K. Hollomon, Jr., Surface–Mount Technology for PC Boards, 1995, Indianapolis, IN, pp. 175–184.
Rambus® Technology Overview, Rambus, Inc., Mountain View, California, Aug. 23, 1999, 14 pages.

Primary Examiner—Darren Schuberg
Assistant Examiner—David Foster
(74) Attorney, Agent, or Firm—Marger Johnson & McCollom, P.C.

(57) ABSTRACT

A printed circuit board utilizes asymmetric striplines to accommodate a large number of transmission lines on a six-layer board. The asymmetric striplines are formed from two signal layers that are sandwiched between two reference planes such that the traces in each signal layer form asymmetric striplines with the two reference planes. Two additional signal layers are arranged on the outside of the reference planes so as to form microstrips with the reference planes.

20 Claims, 4 Drawing Sheets

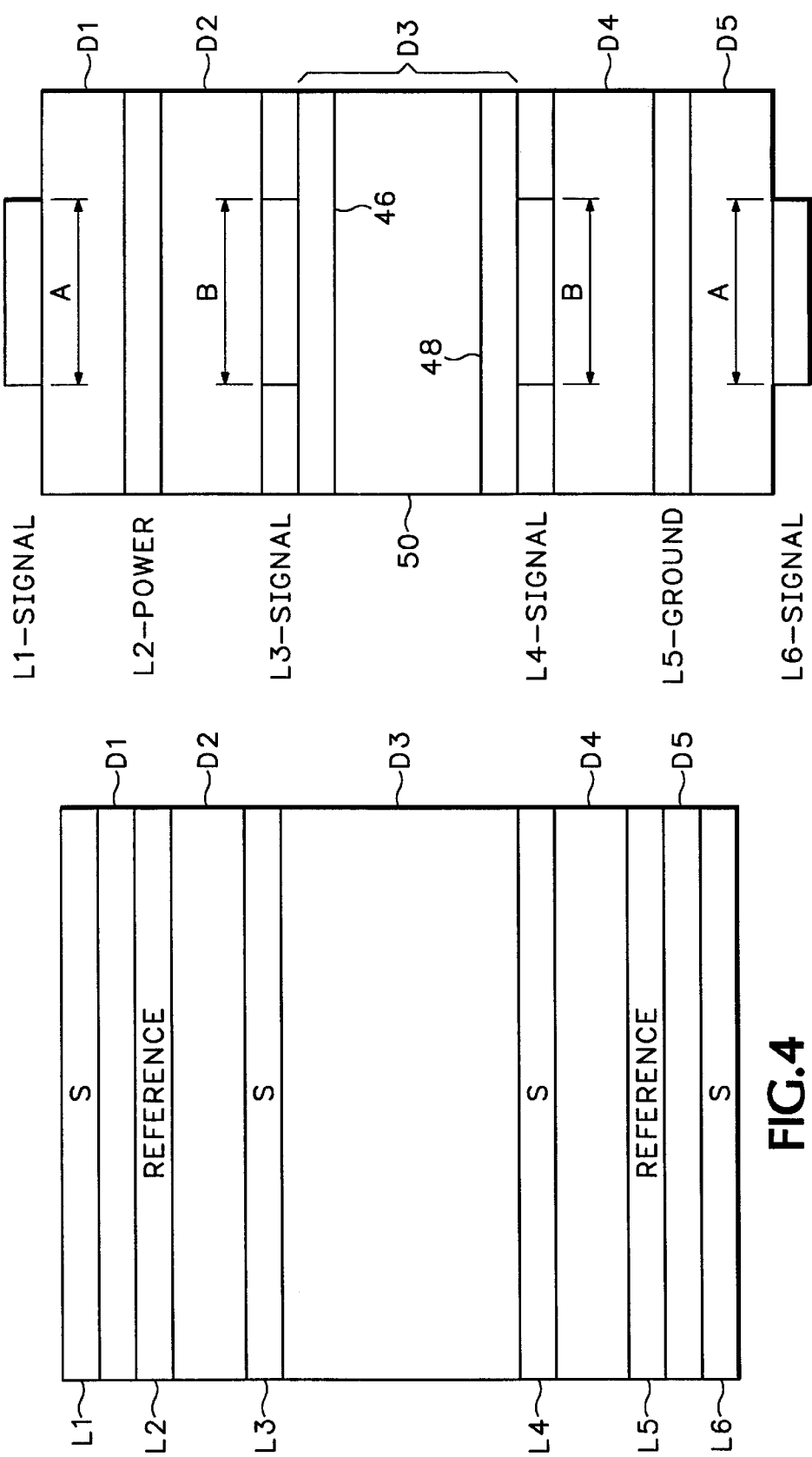

DUAL CHANNEL BUS ROUTING USING ASYMMETRIC STRIPLINES

BACKGROUND OF THE INVENTION

Rambus is a high-throughput chip-to-chip bus system intended primarily for interfacing memory devices to a central processing unit (CPU) on a printed circuit board (PC board). Referring to FIG. 1, the main components of a typical Rambus memory system 10 are a memory controller 12, a Rambus channel 14, one or more Rambus dynamic random access memory (RDRAM) chips 16, and a termination network 18.

The memory controller is part of a chipset that interfaces a CPU chip to the rest of the computer system. The memory controller includes a Rambus interface 20 configured to operate as a master, while the RDRAM chips include Rambus interfaces 22 which operate in slave mode. The RDRAM chips in a Rambus system are packaged in Rambus Inline Memory Modules (RIMMs) which are typically connected to the Rambus channel on a PC board using plug-in connectors. The Rambus channel carries signals between the components of the system using conductors on a PC board known as "traces". A Rambus channel includes enough traces to carry 33 active signals of which 30 are high-speed Rambus Signaling Level (RSL) signals. These RSL signals typically operate at a voltage swing of about 800 mV and include the following signals: ClockToMaster (and its complement ClockToMasterN); ClockFromMaster (and its complement ClockFrom MasterN); Data bus lines DQA[8:0], DQB[8:0]; and Address and Control bus lines ROW[2:0], COL[4:0]. To increase system throughput, multiple Rambus channels may be utilized so that memory devices on both channels may be accessed simultaneously. This increases the total number of active signals that must be accommodated on the PC board.

The RSL signals in a Rambus system operate at very high speeds, so the PC board traces that carry these signals must be treated as transmission lines having a consistent characteristic impedance. A transmission line must be properly terminated to prevent reflected signals from interfering with the operation of the system. Therefore, the termination network 18 includes termination resistors that match the impedance of the RSL signal traces.

One common technique for implementing transmission lines on a printed circuit board is shown in FIG. 2 which is a cross-section of a type of PC board transmission line known as a "microstrip." The PC board shown in FIG. 2 includes a dielectric layer 26 formed from fiberglass having a thickness "H" and a dielectric constant "$\epsilon$". The fiberglass layer is typically formed from fiberglass cloth that is pre-impregnated (prepreg) with resin that is cured to produce a rigid board. A layer of copper foil 28 is bonded to one side of the prepreg layer to form a reference plane 28, which in this case is a ground (GND) plane.

A signal layer is formed by applying foil-plating, and etching copper traces on the side of the prepreg layer opposite the ground plane. In the example of FIG. 2, the signal (S) trace 30 is plated to a thickness of "T" and formed with a trace width "W". The characteristic impedance of the microstrip transmission line formed between the trace 30 and the ground plane depends primarily on the trace width "W", the dielectric constant "$\epsilon$" of the dielectric material, and the thickness "H" of the dielectric layer. Increasing the trace width reduces the impedance, whereas increasing the thickness "H" increases the impedance. Ground isolation traces 32 are often run parallel to the signal traces to reduce cross talk between signal traces.

Another technique for implementing transmission lines on a printed circuit board is shown in FIG. 3 which is a cross-section of a type of PC board transmission line known as a "stripline." In FIG. 3, the signal layer is sandwiched between two dielectric layers 34 and 36, each having a reference plane 38 and 40, respectively, opposite the signal layer. In this example, reference plane 38 is a power plane, and reference plane 40 is a ground plane. As with a microstrip, the characteristic impedance of a stripline depends primarily on the signal trace width "W", the dielectric constant "$\epsilon$" of the dielectric material, and the thickness "H" of the dielectric layers. The signal layer of the stripline of FIG. 3 is shown with one signal trace 42, and two ground isolation traces 44.

BRIEF DESCRIPTION OF THE DRAWINGS

FIG. 4 shows a cross-section of an embodiment of a PC board in accordance with the present invention.

FIG. 5 shows a cross-section of a preferred embodiment of a PC board in accordance with the present invention.

DETAILED DESCRIPTION

Figure 1:
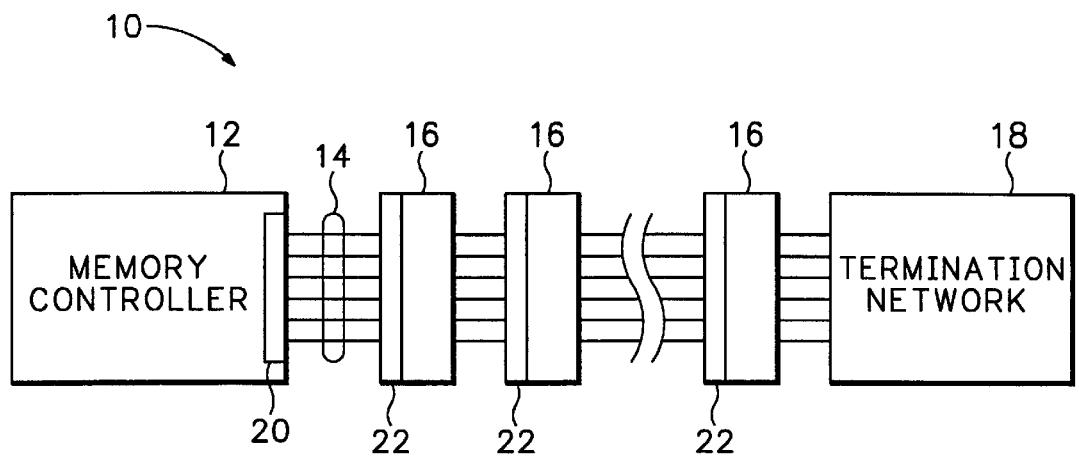
FIG. 1 is a simplified schematic drawing showing the main components of a typical prior art single channel Rambus memory system.
Figure 2:
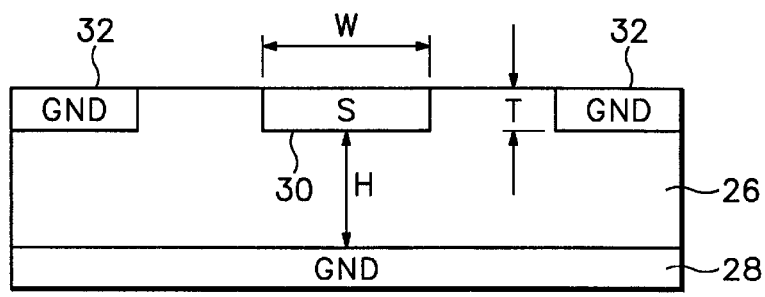
FIG. 2 shows a cross-section of a prior art microstrip transmission line fabricated on a printed circuit board.
Figure 3:
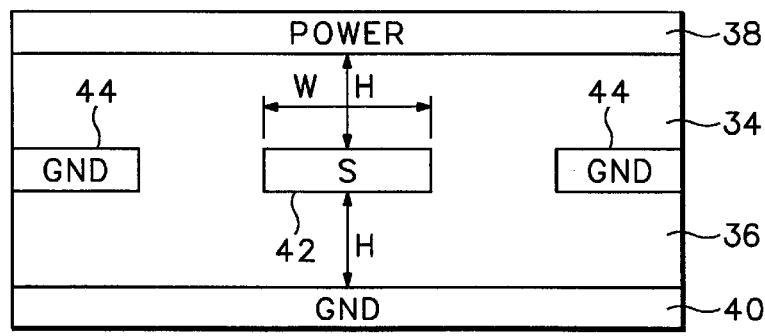
FIG. 3 shows a cross-section of a prior art stripline transmission line fabricated on a printed circuit board.

FIG. 4 shows a cross-section of an embodiment of a PC board in accordance with the present invention. The PC board of FIG. 4 includes a first reference plane L2 and a second reference plane L5. A top signal layer L1 is separated from the first reference plane by a dielectric layer D1. Signal traces in the top signal layer form microstrips with the first reference plane. A bottom signal layer L6 is separated from the second reference plane by a dielectric layer D5 so that signal traces in the bottom signal layer form microstrips with the second reference plane.

An inner signal layer L3 is arranged between the reference planes so as to form an asymmetric stripline with the reference planes. Another inner signal layer L4 is also arranged between the power and ground planes so as to form an asymmetric stripline with the reference planes. The L3 layer is separated from the first reference plane by a dielectric layer D2, and the L4 layer is separated from the second reference plane by a dielectric layer D4. A dielectric layer D3 forms a core and separates the L3 and L4 signal layers.

The PC board shown in FIG. 4 may easily accommodate two Rambus channels running through the same area of the board, and it is inexpensive to fabricate because only six metallic layers are needed. In a typical practical embodiment, RSL signal traces for one Rambus channel are routed on the L1 and L3 layers, and the RSL signal traces for the other Rambus channel are routed on the L4 and L6 layers as described in more detail below. Alternatively, the traces for one channel may be routed on the L1 and L6 layers, while the traces for the other channel are routed on the L3 and L4 layers.

FIG. 5 shows a cross-section of a preferred embodiment of a PC board in accordance with the present invention, including more of the details for a board that may accommodate a dual-channel Rambus system. In the embodiment of FIG. 5, the first and second reference planes L2 and L5 are power and ground planes, respectively, and are fabricated from unplated 1 oz copper having a thickness of 1.2 mils. The L3 and L4 signal layers are also 1 oz unplated copper with a thickness of 1.2 mils. The L1 and L6 signal layers are fabricated from ½ oz plated copper having a thickness of 2.1 mils. The microstrip traces on layers L1 and L6 have a width "A" of 18 mils, and the stripline traces on layers L3 and L4 also have a width "B" of 18 mils.

In most Rambus memory systems for CPU motherboards using RIMM memory modules, the Rambus channel is designed so that each RSL signal trace has a characteristic impedance of 28 ohms. In a Rambus channel controlled by the memory controller hub (MCH) in the Intel 820 and 840 chipsets, supplied by Intel Corporation, Santa Clara, Calif., the RSL signal traces must be no wider than about 18 mils (thousandths of an inch) so that the traces may "breakout" from the MCH chip. That is, traces connected to terminal pins near the center of the MCH chip must no wider than about 18 mils to be able to run between pins near the periphery of the chip in order to reach other devices on the PC board. With 18 mil wide signal traces, and assuming the dielectric constant ∈=4.5 (which is typical for prepreg fiberglass), the dielectric layer for a microstrip must be about 4 mils thick to maintain a 28 ohm characteristic impedance.

Therefore, in a preferred embodiment, the D1 and D5 dielectric layers are preferably formed from 4 mil prepreg fiberglass commonly known as "2116." The D2 and D4 dielectric layers are preferably formed from a 4.3 mil thick material known as "Thincore." The D3 dielectric layer is formed from a 23 mil core 50 sandwiched between two layers of 6.5 mil prepreg fiberglass 46 and 48 commonly known as "7628." If these material thicknesses are used, the total board thickness comes out to about the standard 63 mils (1/16 inch). The present invention, however, is not limited to these details.

Figure 6:
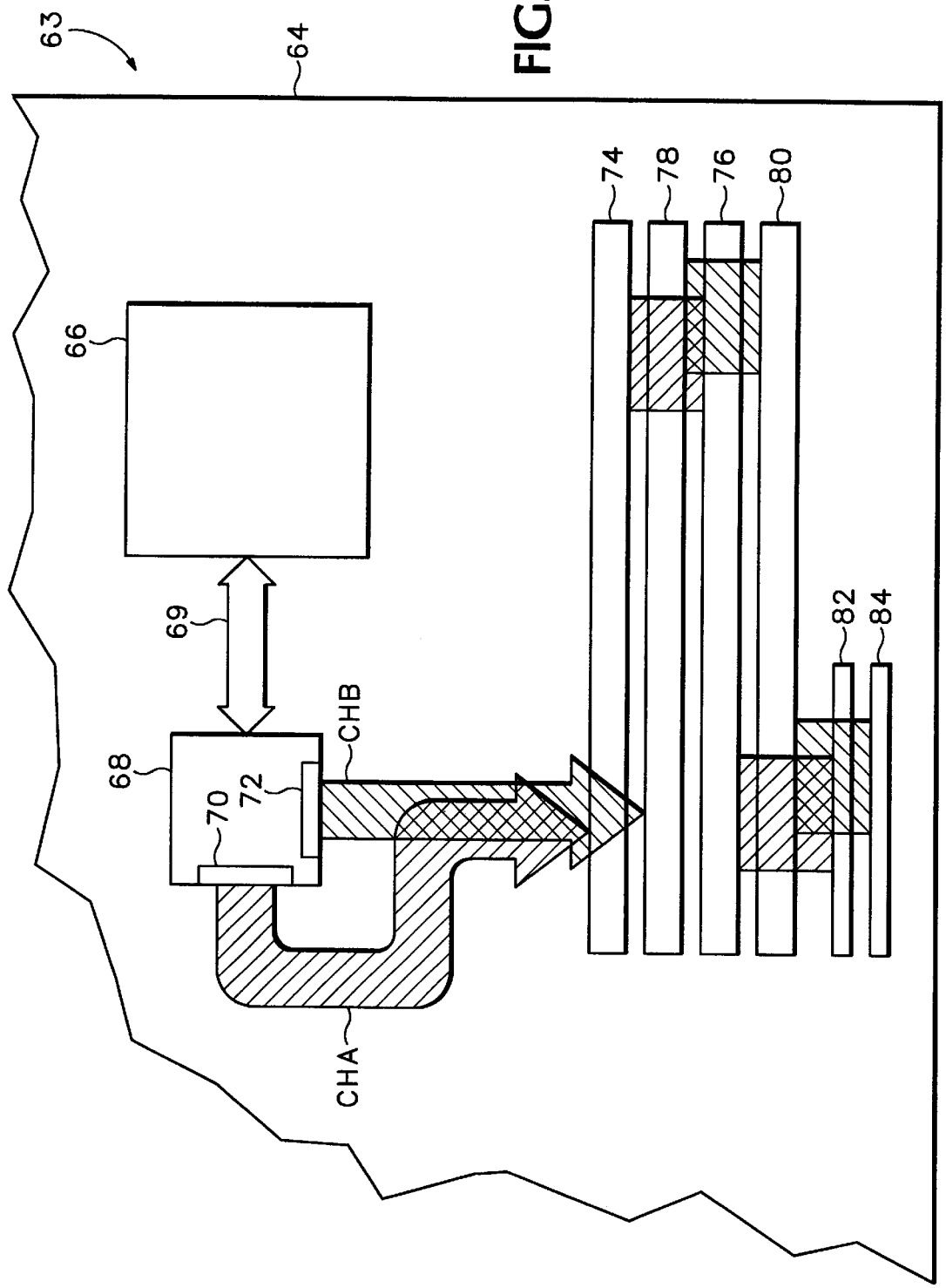
FIG. 6 is a plan view showing exemplary component placement and trace routings for an embodiment of a PC board assembly in accordance with the present invention.

FIG. 6 is a plan view showing preferred component placement and trace routings for an embodiment of a PC board assembly 63 in accordance with the present invention. The PC board assembly of FIG. 6 shows how an exemplary dual channel Rambus memory system may be implemented using a six-layer PC board as shown in FIGS. 4 or 5. Referring to FIG. 6, the PC board assembly includes a PC board 64 which is a motherboard for a personal computer having a CPU 66. A memory controller chip 68 is interfaced to the CPU through the system bus 69. The memory controller is interfaced to the rest of the memory system through Rambus interfaces 70 and 72 for Rambus channels A and B, respectively. As in most Rambus systems, each Rambus interface in the memory controller chip is implemented as a Rambus ASIC Cell (RAC). The RAC manages the electrical and mechanical interface to the Rambus channel.

Each Rambus channel on the PC board assembly of FIG. 6 is connected to two RIMMs. The RIMMs 74 and 76 for channel A are interleaved with the RIMMs 78 and 80 for channel B. After being routed through the RIMMs, the traces for channels A and B are terminated by 27.4 ohm 1% tolerance resistor packs in termination networks 82 and 84. Rambus channel A includes a set of microstrip traces routed on signal layer L1 and a set of asymmetric stripline traces routed on signal layer L3. A first portion of the channel A traces have terminals at one end arranged to accommodate a chip, or a socket for a chip, having a Rambus interface 70 such as a RAC. The terminals at the other end of the first portion of the channel A have terminals arranged to accommodate a socket for RIMM 74. The RIMMs have internal Rambus interfaces which are much simpler that those in the memory controller because they operate in a slave mode. A second portion of the channel A traces are routed from the first RIMM 74 to the second RIMM 76. A third portion connects the second RIMM 76 to the termination network 82.

Rambus channel B includes a set of microstrip traces routed on signal layer L6 and a set of asymmetric stripline traces routed on signal layer L4. As with channel A, the traces in channel B have a first portion running between Rambus interface 72 to the interface on RIMM 78, a second portion between RIMMs 78 and 80, and a third portion between RIMM 80 and the termination network 84.

In the article "Direct Rambus System and Board Design Considerations" published in 1998 by Rambus Inc., it states that all channel traces need to be laid-out in parallel. With the present invention, however, it has been found that some of the traces on signal layers L3 and L4 may be laid-out orthogonally. Specifically, the first portion of the channel A traces on layer L3 have a first section that is orthogonal to a first section of the first portion of the channel B traces on layer L4 as shown in FIG. 6. The first portion of the channel A traces on layer L3 also have a second section that is parallel to a second section of the first portion of the channel B traces on layer L4.

Figure 7:
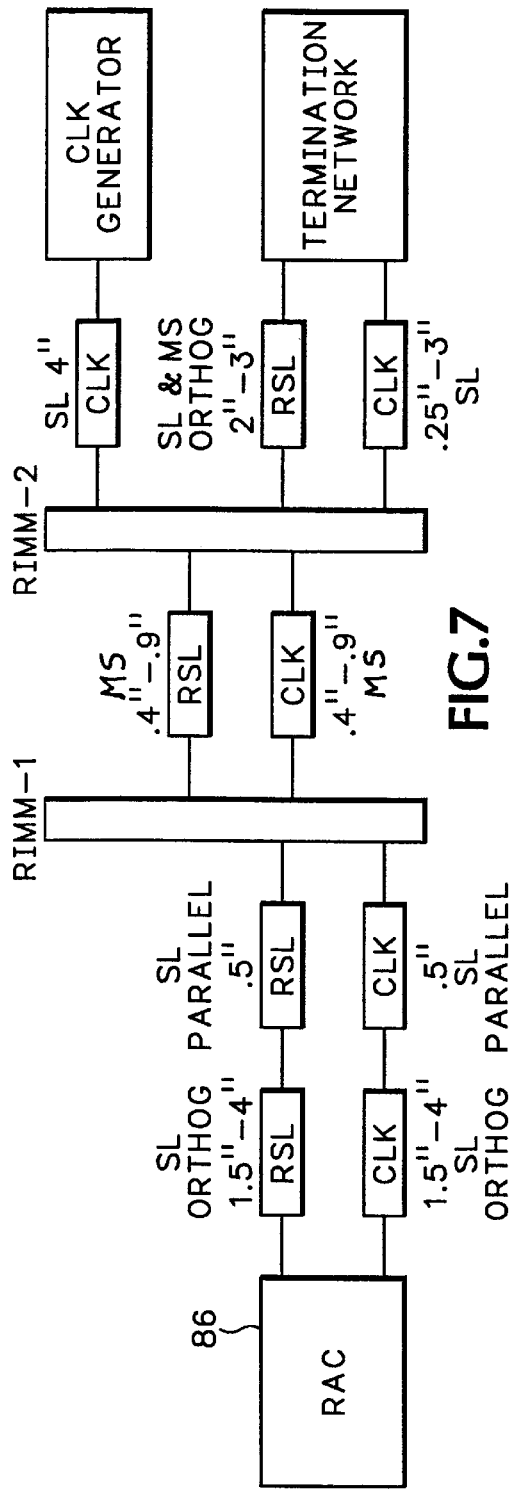
FIG. 7 illustrates a simulation topology for stripline traces in an embodiment of a PC board in accordance with the present invention.
Figure 8:
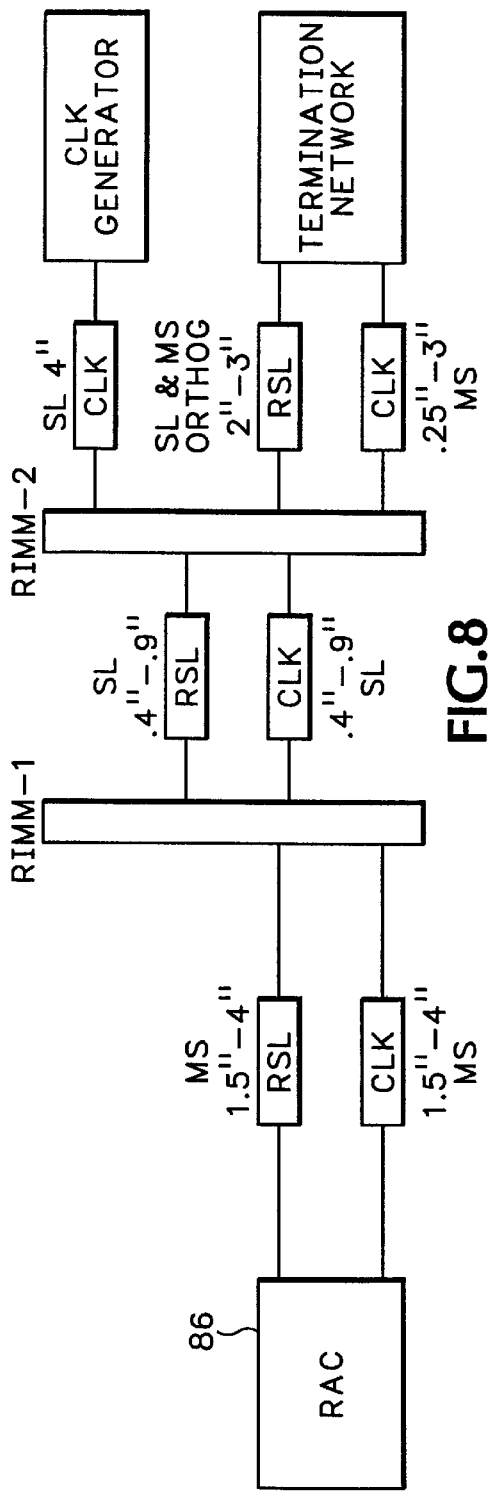
FIG. 8 illustrates a simulation topology for microstrip traces in an embodiment of a PC board in accordance with the present invention.

FIG. 7 shows a topology for simulating the stripline traces on the PC board shown in FIG. 6. In FIG. 7, the RAC 86 corresponds to the interface for either channel A or B in FIG. 6. Likewise, RIMM-1 and RIMM-2 correspond to either RIMMs 74 and 76 or 78 and 80. The transmission lines labeled RSL carry the DQA, DQB, ROW, and COL signals, whereas the transmission lines labeled CLK carry the CTM and CFM clock signals. In FIGS. 7 and 8, SL indicates an asymmetric stripline, and MS indicates a microstrip. The transmission lines in FIG. 7 are shown with their approximate valid lengths in inches. As discussed above, the first portion of the striplines between the RAM and first RIMM has a parallel section and an orthogonal section.

FIG. 8 shows a topology for simulating the microstrip traces on the PC board shown in FIG. 6. As with FIG. 7, the components shown in FIG. 8 correspond to the RAC and RIMMs of either channel A or B. Note that in FIG. 8, a portion of the channel between RIMM-1 and RIMM-2 may actually be an asymmetric stripline rather than a microstrip. Although the embodiments disclosed above are described in context of dual channel Rambus, the use of a PC board stack-up having asymmetric striplines is also useful for single channel Rambus, or for systems having any other number of multiple Rambus channels. Also, although Rambus is intended primarily for interfacing memory to a memory controller, it may also be used as a high speed interface between any devices needing to exchange large amounts of data. Moreover, the present invention is not limited to Rambus channels, but may also be used with any other high speed bus channels that require transmission lines fabricated on PC boards.

Having described and illustrated the principles of the invention in a preferred embodiment thereof, it should be apparent that the invention may be modified in arrangement and detail without departing from such principles. We claim all modifications and variations coming within the spirit and scope of the following claims.

What is claimed is:

1. A printed circuit board comprising:

first and second signal layers;

first and second reference planes arranged between the first and second signal layers such that a trace in the first signal layer functions as a microstrip with the first reference plane, and a trace in the second signal layer functions as a microstrip with the second reference plane;

third and fourth signal layers arranged between the first and second reference planes such that a trace in the third signal layer functions as an asymmetric stripline with the first and second reference planes, and a trace in the fourth signal layer functions as an asymmetric stripline with the first and second reference planes;

a first dielectric layer between the first signal layer and the first reference plane;

a second dielectric layer between the second signal layer and the second reference plane;

a third dielectric layer between the third signal layer and the first reference plane;

a fourth dielectric layer between the fourth signal layer and the second reference plane; and a fifth dielectric layer between the third and fourth signal layers.

2. A printed circuit board according to claim 1 further comprising:

a first set of terminals arranged to accommodate a first Rambus interface; and a second set of terminals arranged to accommodate a second Rambus interface;

wherein the first and third signal layers comprise traces coupled between the first set of terminals and the second set of terminals.

3. A printed circuit board according to claim 2 wherein the first set of terminals is coupled to a RAC and the second set of terminals is coupled to a RIMM.

4. A printed circuit board according to claim 2 further comprising:

a third set of terminals arranged to accommodate a third Rambus interface; and a fourth set of terminals arranged to accommodate a fourth Rambus interface;

wherein the second and fourth signal layers comprise traces coupled between the first set of terminals and the second set of terminals.

5. A printed circuit board according to claim 4 wherein:

the first set of terminals is coupled to a first RAC and the second set of terminals is coupled to a first RIMM; and the third set of terminals is coupled to a second RAC and the fourth set of terminals is coupled to a second RIMM.

6. A printed circuit board comprising:

a first bus channel having a first set of microstrip traces and a first set of asymmetric stripline traces;

a second bus channel having a second set of microstrip traces and a second set of asymmetric stripline traces;

wherein the first and second set of asymmetric stripline traces are arranged between two reference planes.

7. A printed circuit board according to claim 6 wherein a first section of the first set of asymmetric stripline traces are orthogonal to a first section of the second set of asymmetric stripline traces.

8. A printed circuit board according to claim 6 wherein a first section of the first set of asymmetric stripline traces are parallel to a first section of the second set of asymmetric stripline traces.

9. A printed circuit board according to claim 6 wherein:

the first set of microstrip traces are coupled between a RAC and a first RIMM; and the first set of asymmetric stripline traces are coupled between the first RIMM and a second RIMM.

10. A printed circuit board according to claim 6 wherein:

the first set of asymmetric stripline traces are coupled between a RAC and a first RIMM; and the first set of microstrip traces are coupled between the first RIMM and a second RIMM.

11. A printed circuit board assembly comprising:

a printed circuit board having a first bus channel and a second bus channel;

a memory controller having a first bus interface coupled to the first bus channel and a second bus interface coupled to the second bus channel;

a first memory device coupled to the first bus channel; and a second memory device coupled to the second bus channel;

wherein the printed circuit board comprises:

first and second reference planes;

first and second signal layers having traces arranged to function as microstrips with the first and second reference planes, respectively; and third and fourth signal layers having traces arranged between the reference planes to function as asymmetric striplines with the reference planes.

12. A printed circuit board assembly according to claim 11 wherein:

the first and second bus interfaces are Rambus interfaces; and the first and second bus channels are Rambus channels.

13. A printed circuit board assembly according to claim 11 wherein the first bus channel comprises traces in the first and third signal layers.

14. A printed circuit board assembly according to claim 13 wherein the second bus channel comprises traces in the second and fourth signal layers.

15. A printed circuit board assembly according to claim 11 wherein:

the first bus channel comprises traces in the third signal layer; and the second bus channel comprises traces in the fourth signal layer.

16. A printed circuit board assembly according to claim 15 wherein a section of the traces in the third signal layer are orthogonal to a section of the traces in the fourth signal layer.

17. A printed circuit board assembly according to claim 15 wherein a section of the traces in the third signal layer are parallel to a section of the traces in the fourth signal layer.

18. A printed circuit board assembly according to claim 11 wherein:

the first bus channel comprises traces in the first and second signal layers; and the second bus channel comprises traces in the third and fourth signal layers.

19. A printed circuit board assembly according to claim 11 further comprising:

a third memory device coupled to the first bus channel; and fourth memory device coupled to the second bus channel.

20. A printed circuit board assembly according to claim 16 further comprising:

a first termination network coupled to the to the first bus channel; and a second termination network coupled to the second bus channel.

* * * * *